(12) United States Patent
Ju et al.

(10) Patent No.: US 10,236,635 B2
(45) Date of Patent: Mar. 19, 2019

(54) ELECTRICAL CONNECTOR WITH SHIELD STRUCTURE

(71) Applicant: LOTES CO., LTD, Keelung (TW)

(72) Inventors: Ted Ju, Keelung (TW); Chien Chih Ho, Keelung (TW); Zuo Feng Jin, Keelung (TW); Chang Wei Huang, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/869,771

(22) Filed: Jan. 12, 2018

(65) Prior Publication Data

US 2018/0375262 A1 Dec. 27, 2018

(30) Foreign Application Priority Data

Jun. 23, 2017 (CN) .......................... 2017 1 0486814

(51) Int. Cl.
*H01R 13/6581* (2011.01)
*H01R 12/57* (2011.01)
(Continued)

(52) U.S. Cl.
CPC ......... *H01R 13/6581* (2013.01); *H01R 12/57* (2013.01); *H01R 12/714* (2013.01);
(Continued)

(58) Field of Classification Search
CPC ...... H01R 13/02; H01R 13/40; H01R 13/502; H01R 13/646; H01R 12/57; H01R 12/714; H01R 12/716
(Continued)

(56) References Cited

U.S. PATENT DOCUMENTS 4,274,700 A * 6/1981 Keglewitsch .......... H01R 4/028
439/682
4,464,007 A * 8/1984 Parmer ................ H01R 12/585
439/389
(Continued)

FOREIGN PATENT DOCUMENTS

CN 201994452 U 9/2011
CN 202034567 U 11/2011
(Continued)

*Primary Examiner* — Edwin A. Leon
*Assistant Examiner* — Milagros Jeancharles
(74) *Attorney, Agent, or Firm* — Locke Lord LLP; Tim Tingkang Xia, Esq.

(57) ABSTRACT

An electrical connector includes: a body provided with multiple ground accommodating holes and multiple signal accommodating holes running through the body vertically. The inner side surfaces of the ground and signal accommodating holes are electrically conductive. An insulating member is separately formed from the body, and is provided with multiple accommodating portions corresponding only to and accommodated in the signal accommodating holes. Multiple signal terminals are respectively provided with at least one positioning portion positioned correspondingly to one accommodating portion so that the signal terminals are not in contact with the signal accommodating holes. Multiple ground terminals have the same structures as the signal terminals, and the positioning portions of the ground terminals are positioned on the inner side surfaces of the ground accommodating holes, so that the inner side surface of each ground accommodating hole has a contact area in contact with the positioning portion of one ground terminal.

12 Claims, 12 Drawing Sheets

(51) Int. Cl.
*H01R 12/71* (2011.01)
*H05K 3/34* (2006.01)
*H01R 13/02* (2006.01)
*H01R 13/502* (2006.01)
*H01R 33/74* (2006.01)
*H01R 13/646* (2011.01)
*H01R 13/40* (2006.01)
*H01R 13/6585* (2011.01)
*H01R 13/6588* (2011.01)

(52) U.S. Cl.
CPC ........... *H01R 12/716* (2013.01); *H01R 13/02* (2013.01); *H01R 13/40* (2013.01); *H01R 13/502* (2013.01); *H01R 13/646* (2013.01); *H01R 33/74* (2013.01); *H05K 3/3426* (2013.01); *H05K 2201/10189* (2013.01); *H05K 2201/10318* (2013.01); *H05K 2201/10424* (2013.01)

(58) Field of Classification Search
USPC .... 439/81, 83, 931, 607.55, 607.05, 607.02, 439/607.08, 607.27, 607.01, 607
See application file for complete search history.

(56) References Cited

U.S. PATENT DOCUMENTS

| | | | | |
|---|---|---|---|---|
| 5,582,519 A * | 12/1996 | Buchter | ............... | H01R 13/652 439/101 |
| 6,024,584 A * | 2/2000 | Lemke | ............... | H01R 43/0256 439/83 |
| 6,325,644 B1 * | 12/2001 | Lemke | ................... | H01R 12/57 439/83 |
| 7,442,083 B1 * | 10/2008 | Ju | ...................... | H01R 13/6599 439/607.05 |
| 8,814,603 B2 * | 8/2014 | Chang | ................... | H01R 24/00 439/626 |
| 8,821,192 B2 * | 9/2014 | Chang | ................. | H01R 13/646 439/630 |
| 8,851,904 B2 * | 10/2014 | Chang | .................. | H01R 12/71 439/607.03 |
| 9,065,216 B2 * | 6/2015 | Chang | ................ | H01R 13/6585 |
| 9,178,322 B2 * | 11/2015 | Chang | ................ | H01R 13/6594 |
| 9,240,657 B2 * | 1/2016 | Chang | ................ | H01R 13/6588 |
| 2009/0111325 A1 * | 4/2009 | Ju | ...................... | H01R 13/2442 439/607.55 |
| 2012/0220169 A1 * | 8/2012 | Uozumi | ............... | H01R 12/714 439/660 |
| 2012/0238137 A1 * | 9/2012 | Cai | ........................ | H01R 12/57 439/607.28 |
| 2012/0270451 A1 * | 10/2012 | Ju | ........................ | H01R 12/714 439/709 |
| 2013/0267118 A1 * | 10/2013 | Cai | .................... | H01R 13/6581 439/607.01 |
| 2014/0322974 A1 * | 10/2014 | Chang | ................ | H01R 13/6585 439/607.01 |
| 2015/0056857 A1 * | 2/2015 | Chang | ................ | H01R 13/6588 439/607.09 |

FOREIGN PATENT DOCUMENTS

| | | |
|---|---|---|
| CN | 202067919 U | 12/2011 |
| CN | 103579826 A | 2/2014 |
| CN | 103915707 A | 7/2014 |

* cited by examiner

A-A

B-B

ELECTRICAL CONNECTOR WITH SHIELD STRUCTURE

CROSS-REFERENCE TO RELATED PATENT APPLICATION

This application claims priority to and the benefit of, pursuant to 35 U.S.C. § 119(a), patent application Serial No. CN201710486814.4 filed in China on Jun. 23, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present invention relates to an electrical connector, and more particularly to an electrical connector for electrically connecting a chip module to a circuit board.

BACKGROUND

Chinese patent number of CN201020663926.6 discloses an electrical connector, which includes an insulating body, multiple signal terminals, a grounding member, and multiple shielding members. Multiple accommodating tubes are arranged on the insulating body, and each signal terminal is correspondingly accommodated in one accommodating tube. The multiple shielding members are assembled in the insulating body in a layer-upon-layer stacking manner. Each shielding member is provided with multiple shielding holes, and each shielding hole correspondingly surrounds the periphery of one accommodating tube. The accommodating tube where the grounding member is located is provided with a notch, and the grounding member has an extending portion extending out of the notch to achieve an electrical conduction between the plate edge of the extending portion and the plate edge of the shielding member. Consequently, a shielding effect between each two adjacent signal terminals can be achieved, and interference can be prevented during signal transmission.

However, in order to avoid short-circuiting when the signal terminals abut the shielding member, each signal terminal is not provided with the extending portion abutting the shielding member, such that the signal terminal and the grounding member are different in structure. As a result, during practical production, the difficulty of machining the signal terminal and the grounding member is increased. Moreover, during assembly, it is easy for an operator to mistakenly assemble the signal terminal into the accommodating tube where the grounding member is located, so that the signal terminal does not abut the shielding member, thereby affecting the shielding effect of the electrical connector and decreasing the anti-interference capability during signal transmission.

Therefore, a heretofore unaddressed need to design a novel electrical connector exists in the art to address the aforementioned deficiencies and inadequacies.

SUMMARY

The present invention is directed to an electrical connector that has a good shielding effect.

In order to achieve the foregoing objective, one aspect of the present invention adopts the following technical solution: an electrical connector, including: a body, provided with a plurality of ground accommodating holes and a plurality of signal accommodating holes vertically running through the body, wherein inner side surfaces of the ground accommodating holes and the signal accommodating holes are electrically conductive; an insulating member, separately formed from the body, wherein the insulating member is provided with a plurality of accommodating portions corresponding only to the signal accommodating holes and accommodated in the signal accommodating holes; a plurality of signal terminals, respectively provided with at least one positioning portion positioned correspondingly to one of the accommodating portions so that the signal terminals are not in contact with the signal accommodating holes; and a plurality of terminals, each having the same structure and respectively provided with at least one positioning portion, the terminals include a plurality of signal terminals and a plurality of ground terminals; wherein the positioning portion of each of the signal terminals is correspondingly positioned to one of the accommodating portions so that the signal terminals are not in contact with the signal accommodating holes; and the positioning portion of each of the ground terminals is correspondingly positioned on the inner side surface of one of the ground accommodating holes, so that the inner side surface of each of the ground accommodating holes has a contact area in contact with the positioning portion of a corresponding one of the ground terminals, and a height of the contact area is between a highest point and a lowest point of each of the accommodating portions.

In certain embodiments, the insulating member is provided with a plurality of holes corresponding to the ground terminals, the body is provided with a plurality of position limiting portions corresponding to and accommodated in the holes, and the ground terminals pass through the position limiting portions.

In certain embodiments, the body has an upper surface and a lower surface arranged opposite to each other, the ground accommodating holes and the signal accommodating holes run through the upper surface and the lower surface, the inner side surfaces of the ground accommodating holes and the signal accommodating holes are inclined relative to the upper surface and the lower surface, and side surfaces of the accommodating portions are inclined relative to the upper surface and the lower surface.

In certain embodiments, each of the signal terminals has a through hole accommodated in and extending upward beyond a corresponding one of the accommodating portions, the positioning portion of each of the signal terminals is formed by tearing from the through hole to match with and be positioned to the corresponding one of the accommodating portions, and a length of the through hole is greater than a length of the positioning portion.

In certain embodiments, each of the signal terminals has a flat plate portion accommodated in a corresponding one of the accommodating portions, and an elastic arm formed by bending upward and extending from the flat plate portion and configured to be in contact with a chip module, wherein a bent portion between the elastic arm and the flat plate portion is exposed upward out of the corresponding one of the accommodating portions.

In certain embodiments, the elastic arm has a first arm formed by bending upward and extending from the flat plate portion in a direction away from a vertical plane of the flat plate portion, and a second arm bending backward from the first arm and extending beyond the vertical plane of the flat plate portion, wherein the second arm is configured to upward abut the chip module, one side of the first arm is protrudingly provided with a strip-connecting portion configured to be connected to a strip, and the strip-connecting portion is parallel to the flat plate portion.

In certain embodiments, the elastic arm has a first arm formed by upwardly bending and extending from the flat plate portion in a direction away from the vertical plane of the flat plate portion, and a second arm bending backward from the first arm and extending beyond the vertical plane of the flat plate portion, the second arm is configured to upwardly abut against the chip module, each of the signal accommodating holes has a stopping surface located above or below a corresponding one of the accommodating portions to stop the corresponding one of the accommodating portions vertically downward or upward, and the first arm and the stopping surface are located on two opposite sides of the flat plate portion.

In certain embodiments, the insulating member has a main body located on the body, the accommodating portions are formed by extending downward from the main body, and a plurality of supporting portions are formed by extending upward from the main body and configured to support a chip module.

In certain embodiments, the body has an upper surface and a lower surface arranged opposite to each other, the ground accommodating holes and the signal accommodating holes run through the upper surface and the lower surface, the lower surface is electrically conductive, and bottom surfaces of the accommodating portions are lower than the lower surface.

In certain embodiments, each of the ground terminals has a soldering portion being downward beyond the lower surface, the soldering portion is soldered to a circuit board through a solder, the body has a frame portion formed by extending downward from the lower surface and configured to accommodate the soldering portion and the solder, and an inner side surface of the frame portion is electrically conductive.

Another aspect of the present invention is directed to an electrical connector, including: a body, provided with a plurality of ground accommodating holes and a plurality of signal accommodating holes vertically running through the body, wherein surfaces of the ground accommodating holes and the signal accommodating holes are respectively electrically conductive; an insulating member, separately formed from the body; and a plurality of signal terminals and a plurality of ground terminals with same structure, correspondingly accommodated in the signal accommodating holes and the ground accommodating holes respectively, and respectively provided with at least one positioning portion, wherein the positioning portions of the signal terminals are positioned in the insulating member, so that the signal terminals are not in contact with the surfaces of the signal accommodating holes; the positioning portions of the ground terminals are positioned on the surfaces of the ground accommodating holes, so that the surface of each of the ground accommodating holes has a contact area in contact with the positioning portion of a corresponding one of the ground terminals, and a height of the contact area is between a highest point and a lowest point of the insulating member.

In certain embodiments, the insulating member is provided with a plurality of holes corresponding to the ground terminals, the body is provided with a plurality of position limiting portions corresponding to and accommodated in the holes, and the ground terminals pass through the position limiting portions.

In certain embodiments, each of the signal terminals has a flat plate portion accommodated in the insulating member, and an elastic arm formed by bending upward and extending from the flat plate portion and configured to be in contact with a chip module, wherein a bent portion between the elastic arm and the flat plate portion is exposed upward out of the insulating member.

In certain embodiments, the elastic arm has a first arm formed by bending upward and extending from the flat plate portion in a direction away from a vertical plane of the flat plate portion, and a second arm bending backward from the first arm and extending beyond the vertical plane of the flat plate portion, wherein the second arm is configured to upward abut the chip module, one side of the first arm is protrudingly provided with a strip-connecting portion configured to be connected to a strip, and the strip-connecting portion is parallel to the flat plate portion.

In certain embodiments, a size of each of the ground accommodating holes is smaller than a size of each of the signal accommodating holes along a horizontal direction, the insulating member is provided with a plurality of accommodating portions corresponding only to the signal accommodating holes and accommodated in the signal accommodating holes, and the positioning portions of the signal terminals are positioned in the accommodating portions.

In certain embodiments, the insulating member has a main body located on the body, the accommodating portions are formed by extending downward from the main body, and a plurality of supporting portions are formed by extending upward from the main body and configured to support a chip module.

Compared with the related art, the electrical connector according to certain embodiments of the present invention has the following beneficial effects.

The insulating member separately formed from the body is provided, and the signal terminals are positioned in the insulating member. Thus, the insulating member prevents the signal terminals from being in contact with the surfaces of the signal accommodating holes, thereby preventing short-circuiting of the signal terminals. Meanwhile, because the insulating member is not accommodated in the ground accommodating holes, the ground terminals can be positioned on and in contact with the surfaces of the ground accommodating holes, thereby achieving grounding, and ensuring the shielding effect of the electrical connector. Moreover, the ground terminals and the signal terminals can have the same structures, thus decreasing the difficulty of machining the ground terminals and the signal terminals. Furthermore, an operator does not need to differentiate the positions of the ground terminals and the signal terminals any more, thereby decreasing the difficulty of assembling the ground terminals and the signal terminals, preventing the signal terminals from being assembled at the positions of the ground terminals by mistake to cause the ground terminals to fail to be in contact with the inner sides of the ground accommodating holes, ensuring the shielding effect of the electrical connector, and enhancing the anti-interference capability during signal transmission.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment.

DETAILED DESCRIPTION

Figure 1:
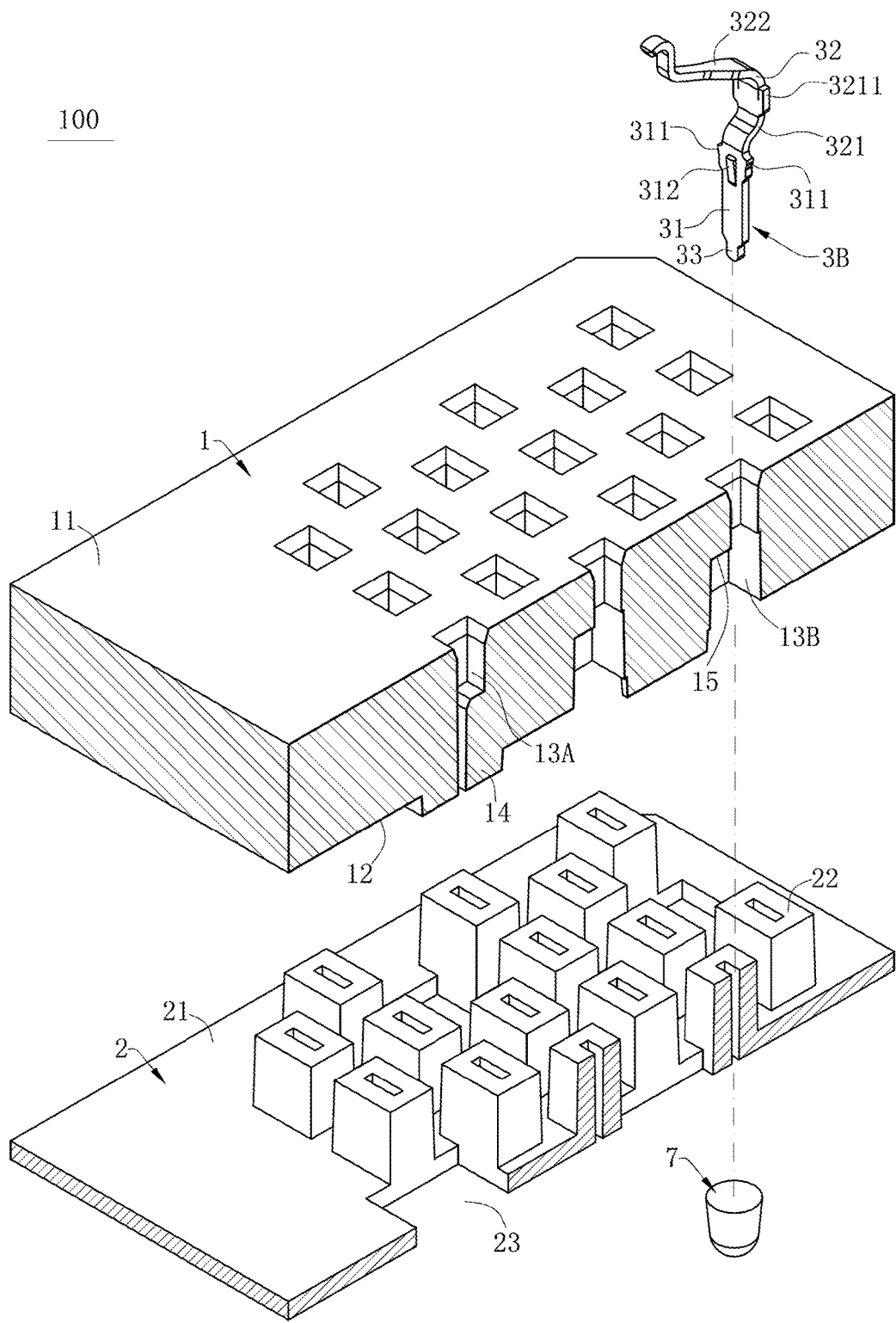
FIG. 1 is a perspective exploded view of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-12. In accordance with the purposes of this invention, as embodied and broadly described herein, this invention, in one aspect, relates to an electrical connector.

FIG. 1 to FIG. 7 show an electrical connector 100 according to a first embodiment of the present invention, which is used to electrically connect a chip module 5 to a circuit board 6. The electrical connector 100 includes: an insulating member 2; a body 1 located on the insulating member 2; and multiple signal terminals 3B and ground terminals 3A having the same structures and running through the body 1 and the insulating member 2. The signal terminals 3B are configured to be in contact with signal pads of the chip module 5, and the ground terminals 3A are configured to be in contact with ground pads of the chip module 5.

Figure 2:
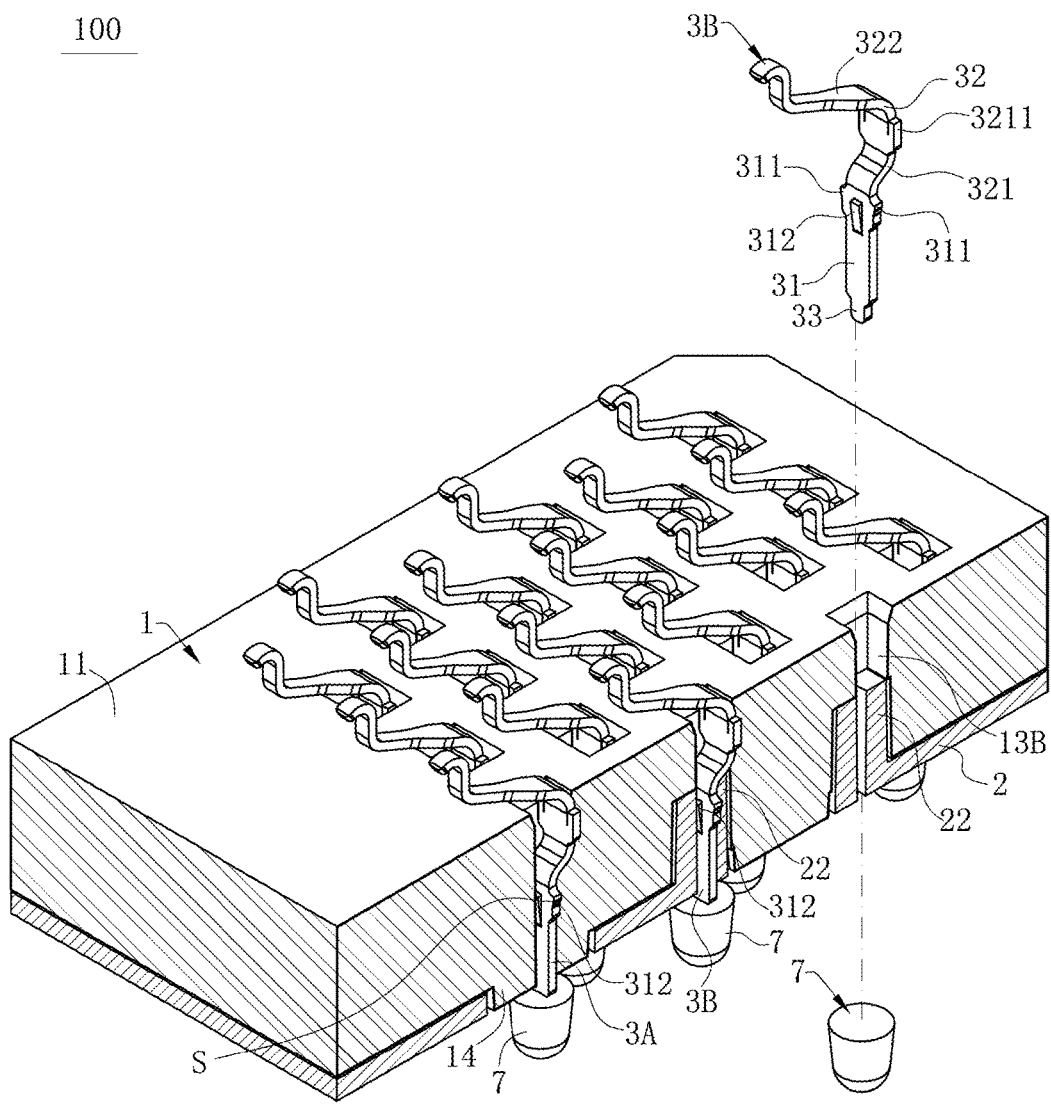
FIG. 2 is a perspective view of an insulating member being mounted under a body in FIG. 1.

As shown in FIG. 1 and FIG. 2, the body 1 has an upper surface 11 and a lower surface 12 which are arranged opposite to each other. Multiple ground accommodating holes 13A and signal accommodating holes 13B run through the upper surface 11 and the lower surface 12, and the inner side surfaces of the ground accommodating holes 13A and the signal accommodating holes 13B are electrically conductive. This is because the raw material of the body 1 is a mixture of a plastic material and metal powders in the present embodiment. Certainly, the metal powders can also be replaced by other conductive materials, or the raw material can also be completely a metal material, so that the whole body 1 is electrically conductive (in the other embodiments, the body 1 can also be made of plastic first, then metal layers are plated on the inner side surfaces of the ground accommodating holes 13A and the signal accommodating holes 13B, so that the inner side surfaces of the ground accommodating holes 13A and the signal accommodating holes 13B are electrically conductive). Along a horizontal direction, a size of each ground accommodating hole 13A is smaller than a size of each signal accommodating hole 13B. Multiple position limiting portions 14 are formed in correspondence to the ground accommodating holes 13A by extending downward from the lower surface 12 of the body 1, and the ground terminals 3A pass through the position limiting portions 14. Each signal accommodating hole 13B has a stopping surface 15.

Figure 4:
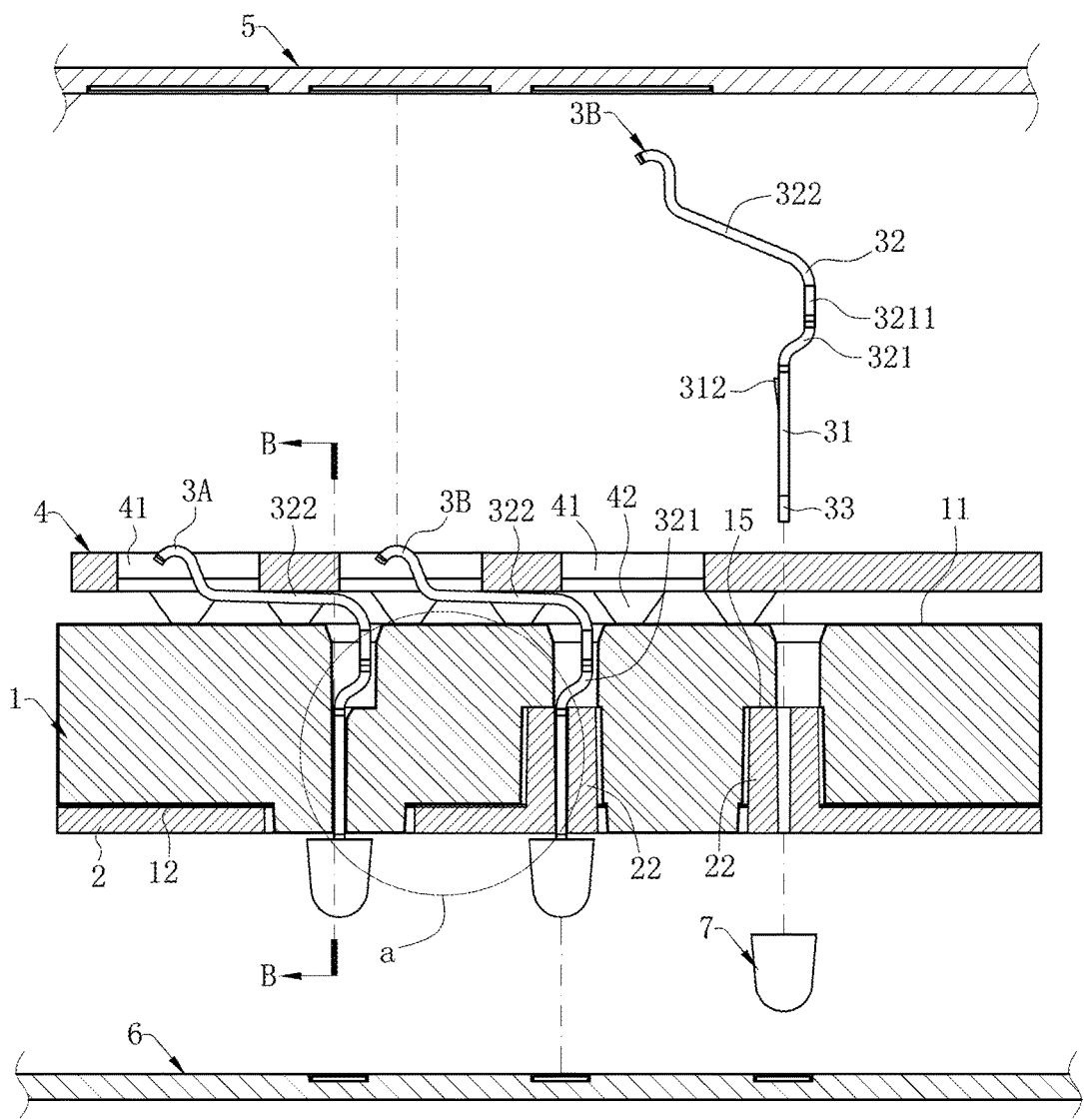
FIG. 4 is a sectional view along an A-A direction before a chip module is pressed down in FIG. 3.

As shown in FIG. 1, FIG. 2 and FIG. 4, the insulating member 2 is separately formed from the body 1. The insulating member 2 has a main body 21 located under the lower surface 12, and the main body 21 is provided with multiple holes 23 corresponding to and accommodate the multiple position limiting portions 14, thereby enhancing the positioning effect between the insulating member 2 and the body 1. Further, a bottom surface of the main body 21 is flush with the bottom surfaces of the position limiting portions 14, that is, the bottom surface of the insulating member 2 is flush with the bottom surface of the body 1, thereby reducing the height of the electrical connector 100. The insulating member 2 is provided with multiple accommodating portions 22 corresponding only to the signal accommodating holes 13B and accommodated in the signal accommodating holes 13B. That is, the insulating member 2 is not provided with any accommodating portion 22 corresponding to and accommodated in the ground accommodating holes 13A. Each accommodating portion 22 is formed by extending upward from the main body 21, and the accommodating portions 22 are located under the stopping surfaces 15, so that the stopping surfaces 15 stop the accommodating portions 22 from moving upward (in the other embodiments, the insulating member 2 can also be arranged above the body 1, and in this case, the stopping surfaces 15 are located under the accommodating portions 22 to stop the accommodating portions 22 from moving downward).

As shown in FIG. 2 and FIG. 4, each signal terminal 3B has a flat plate portion 31 accommodated in one accommodating portion 22, and an elastic arm 32 formed by bending upward and extending from the flat plate portion 31 and configured to be in contact with the chip module 5. A bent portion between the elastic arm 32 and the flat plate portion 31 is exposed upward out of the accommodating portion 22, so that the width of the accommodating portion 22 is reduced. A soldering portion 33 is formed by vertically extending downward from each flat plate portion 31 beyond the lower surface 12. The soldering portion 33 is soldered to the circuit board 6 by being inserted into a solder 7, and a width of the solder 33 is less than a width of the flat plate portion 31.

Each elastic arm 32 has a first arm 321 formed by bending upward and extending from the flat plate portion 31 in a direction away from a vertical plane of the flat plate portion 31 and a second arm 322 bending backward from the first arm 321 and extending beyond the vertical plane of the flat plate portion 31. The second arm 322 is configured to upward abut the chip module 5. The first arm 321 and the stopping surface 15 are located on the two opposite sides of the flat plate portion 31, thereby reducing the space occupied by the signal accommodating holes 13B. One side of each first arm 321 is protrudingly provided with a strip-connecting portion 3211, which is configured to be connected to a strip, and the strip-connecting portions 3211 are parallel to the flat plate portions 31. Because the first arms 321 are close to the upper surface 11 of the body 1, the height of each strip-connecting portion 3211 can be reduced, thereby enhancing the strength of the strip-connecting portions 3211, and allowing the strip to be broken conveniently.

Figure 5:
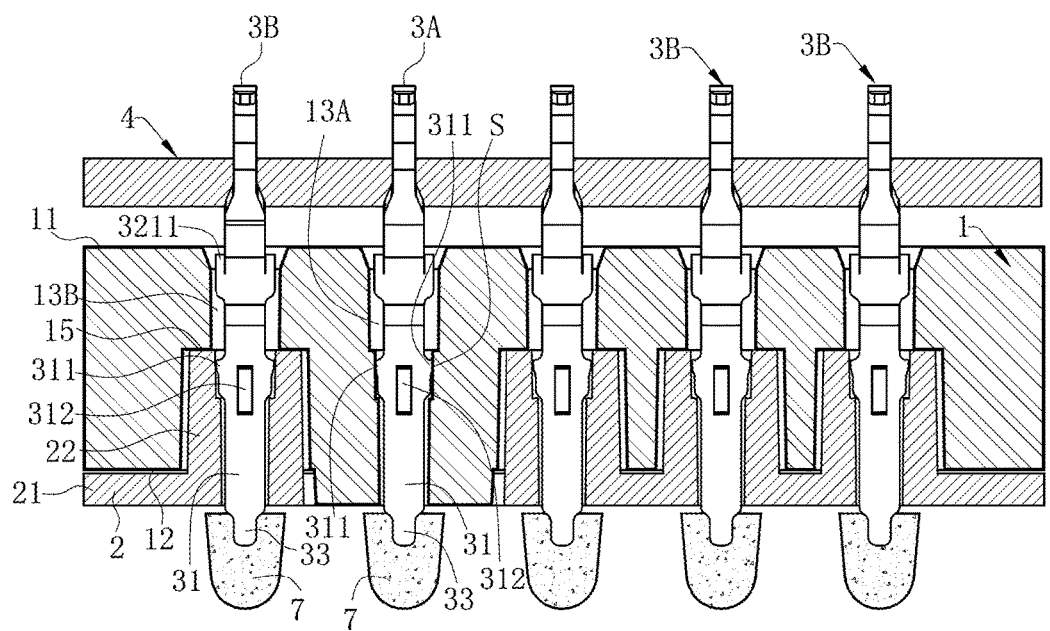
FIG. 5 is a sectional view along a B-B direction in FIG. 4.
Figure 6:
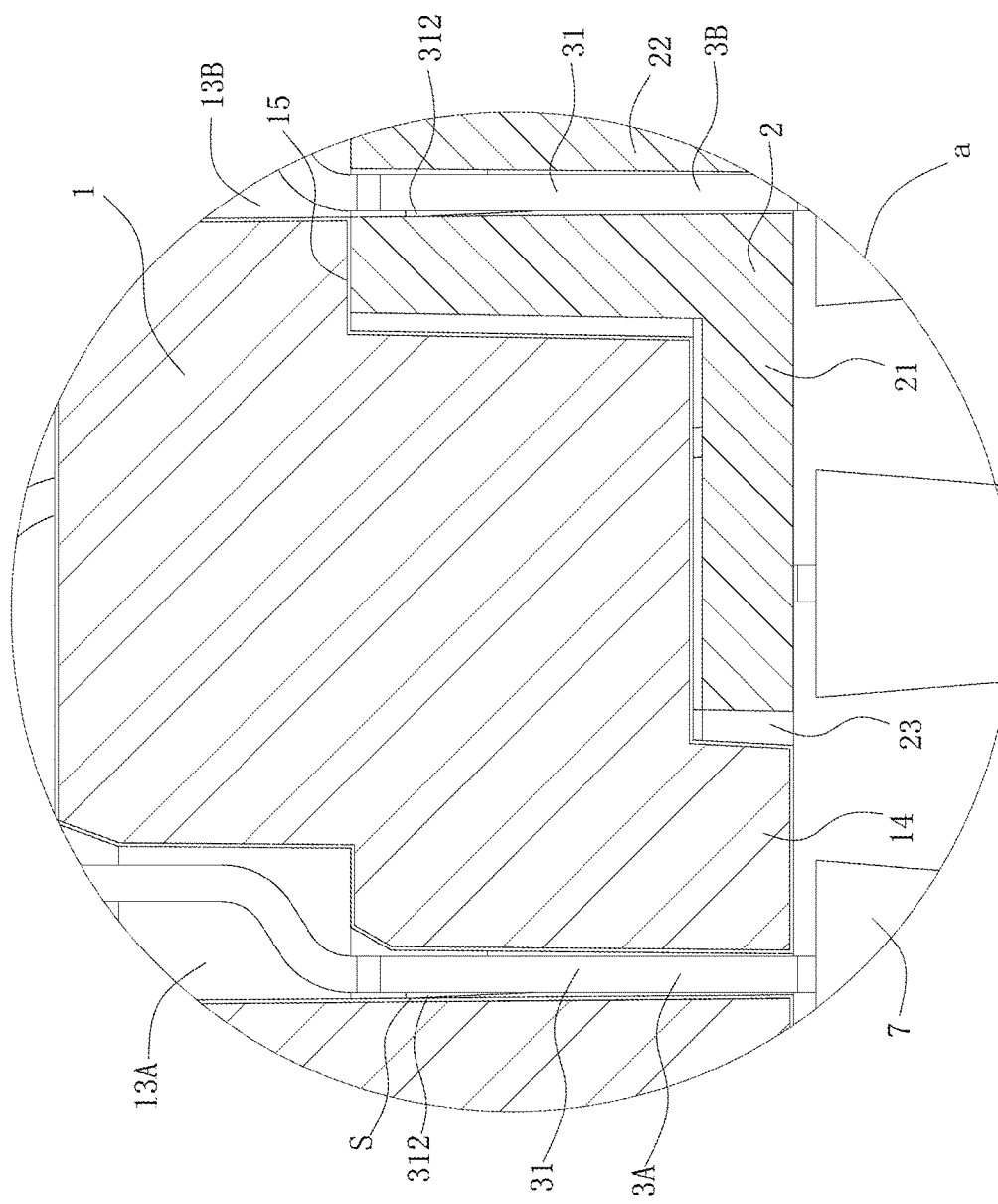
FIG. 6 is an enlarged view of portion a in FIG. 4.

As shown in FIG. 2, FIG. 5 and FIG. 6, the signal terminals 3B are provided with positioning portions positioned in the accommodating portions 22. In the present embodiment, the positioning portions include first positioning portions 311 and second positioning portions 312. The first positioning portions 311 are respectively projected from the two opposite plate edges of the flat plate portion 31, and the second positioning portion 312 is formed by tearing from the plate surface of the flat plate portion 31. The first positioning portions 311 and the second positioning portions 312 respectively match with and are positioned in the corresponding accommodating portions 22 (in the other embodiments, only one first positioning portion 311 or only one second positioning portion 312 can be provided as well), so that the accommodating portions 22 can fix the signal terminals 3B, and can ensure that the signal terminals 3B are not in contact with the signal accommodating holes 13B. The lower end of each second positioning portion 312 is connected to the flat plate portion 31, and the second positioning portion 312 and the first arm 321 are located on the two opposite sides of the flat plate portion 31.

The ground terminals 3A and the signal terminals 3B have the same structures, which is not elaborated herein. The first positioning portions 311 of the ground terminals 3A are positioned on the inner side surfaces of the ground accommodating holes 13A, so that a contact area S is formed on the inner side of each ground accommodating hole 13A to be in contact with the first positioning portions 311 and second positioning portion 312 of one ground terminal 3A, and a height of the contact area S is between a highest point and a lowest point of the accommodating portion 22.

Figure 3:
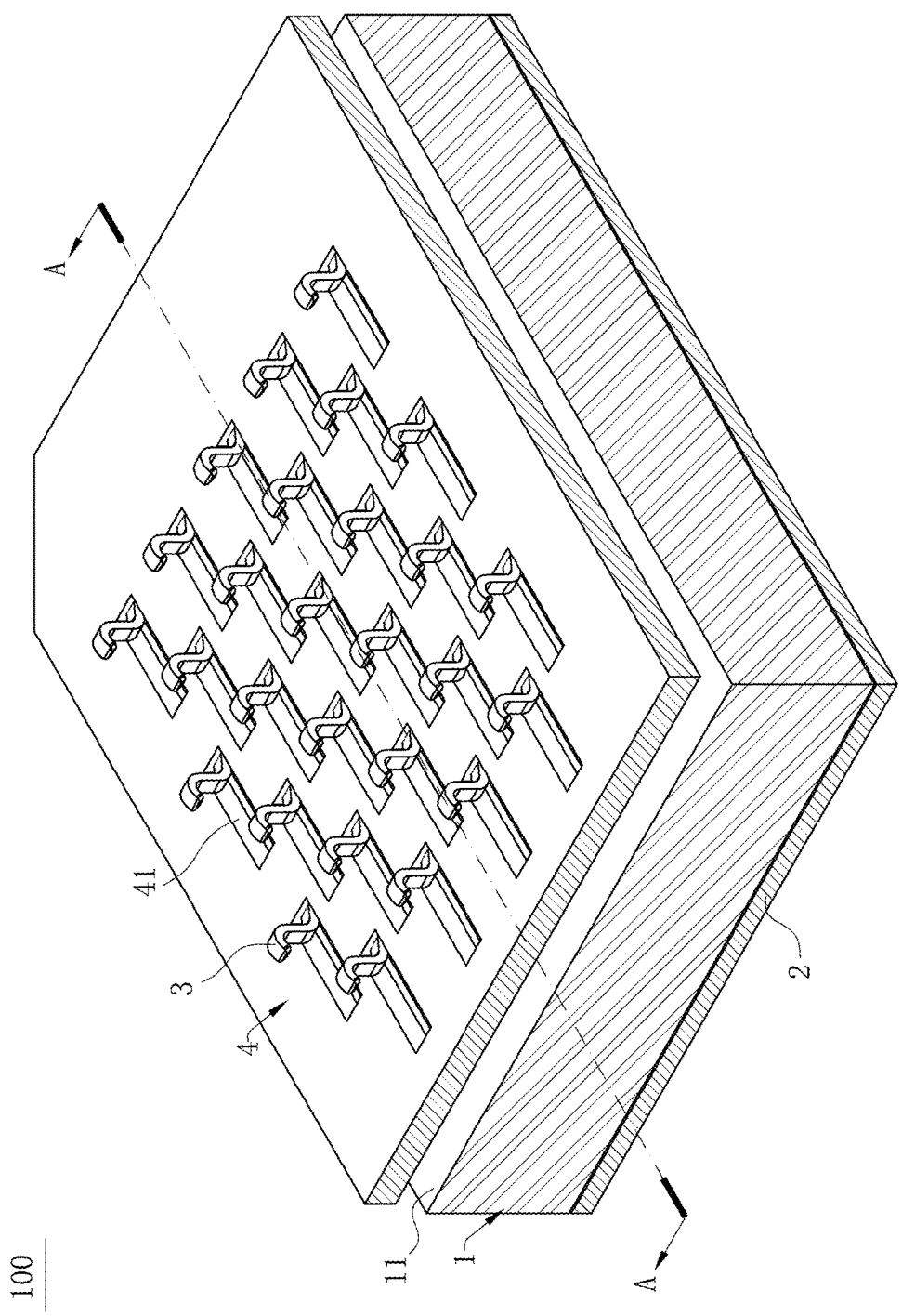
FIG. 3 is a perspective view of a supporting cover being mounted above the body in FIG. 2.
Figure 7:
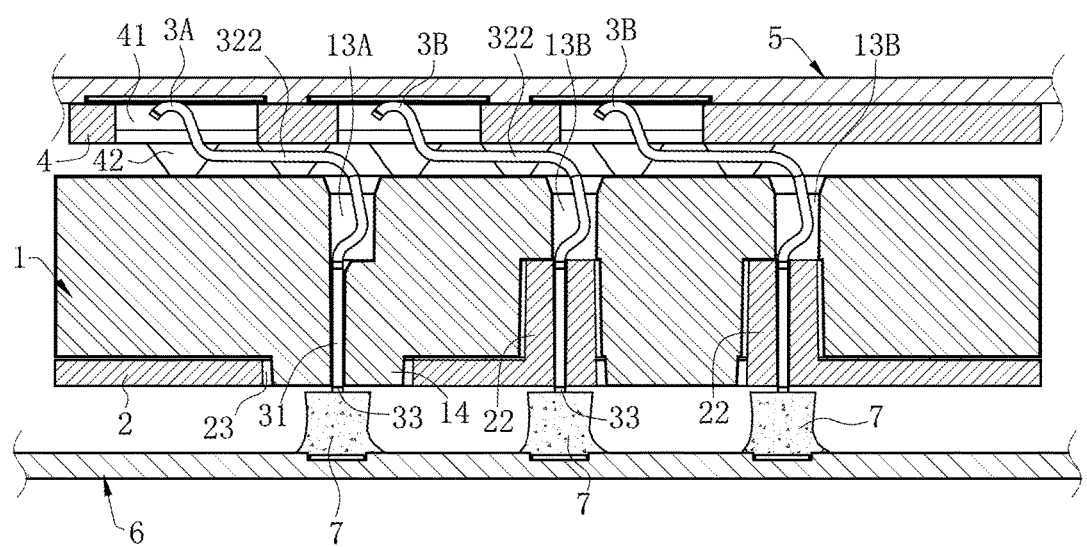
FIG. 7 is a schematic view of the chip module being pressed down in FIG. 4.

As shown in FIG. 3, FIG. 4 and FIG. 7, the electrical connector 100 of the present invention further includes a supporting cover 4 which is arranged on the upper surface 11 of the body 1 to support the chip module 5, preventing the ground terminals 3A and the signal terminals 3B from being injured by pressure in the process of downward pressing the chip module 5. The supporting cover 4 is provided with multiple through slots 41 through which the ground terminals 3A and the signal terminals 3B can respectively pass. Multiple supporting blocks 42 are downward projected from the bottom surface of the supporting cover 4 and are supported on the upper surface 11, so that a gap is formed between the bottom surface of the supporting cover 4 and the upper surface 11. Thus, a deformation space is provided for the ground terminals 3A and the signal terminals 3B, and a large heat dissipation space is formed between the supporting cover 4 and the body 1, so that a great deal of heat generated by the chip module 5 in operation can be dissipated rapidly, and thereby enhancing the stability of the operation of the chip module 5.

As shown in FIG. 1, FIG. 2 and FIG. 7, during assembly, the insulating member 2 is first mounted under the body 1. Then, the ground terminals 3A and the signal terminals 3B are respectively mounted correspondingly into the ground accommodating holes 13A and the signal accommodating holes 13B, so that the ground terminals 3A are fixed in the ground accommodating holes 13A to be in contact with the ground accommodating holes 13A, and the signal terminals 3B are fixed in the insulating member 2. Then the supporting cover 4 is mounted upon the body 1. Afterwards, the electrical connector 100 is placed on the circuit board 6, and the solders 7 are utilized to fixedly solder the electrical connector 100 on the circuit board 6. The chip module 5 is then mounted on the supporting cover 4 of the electrical connector 100. Finally, a downward acting force is applied on the chip module 5, so that the chip module 5 downward abuts the ground terminals 3A and the signal terminals 3B. As the supporting cover 4 supports the chip module 5, the chip module 5 can be prevented from being crushed and the ground terminals 3A and the signal terminals 3B can be prevented from being deformed excessively when pressed.

Figure 8:
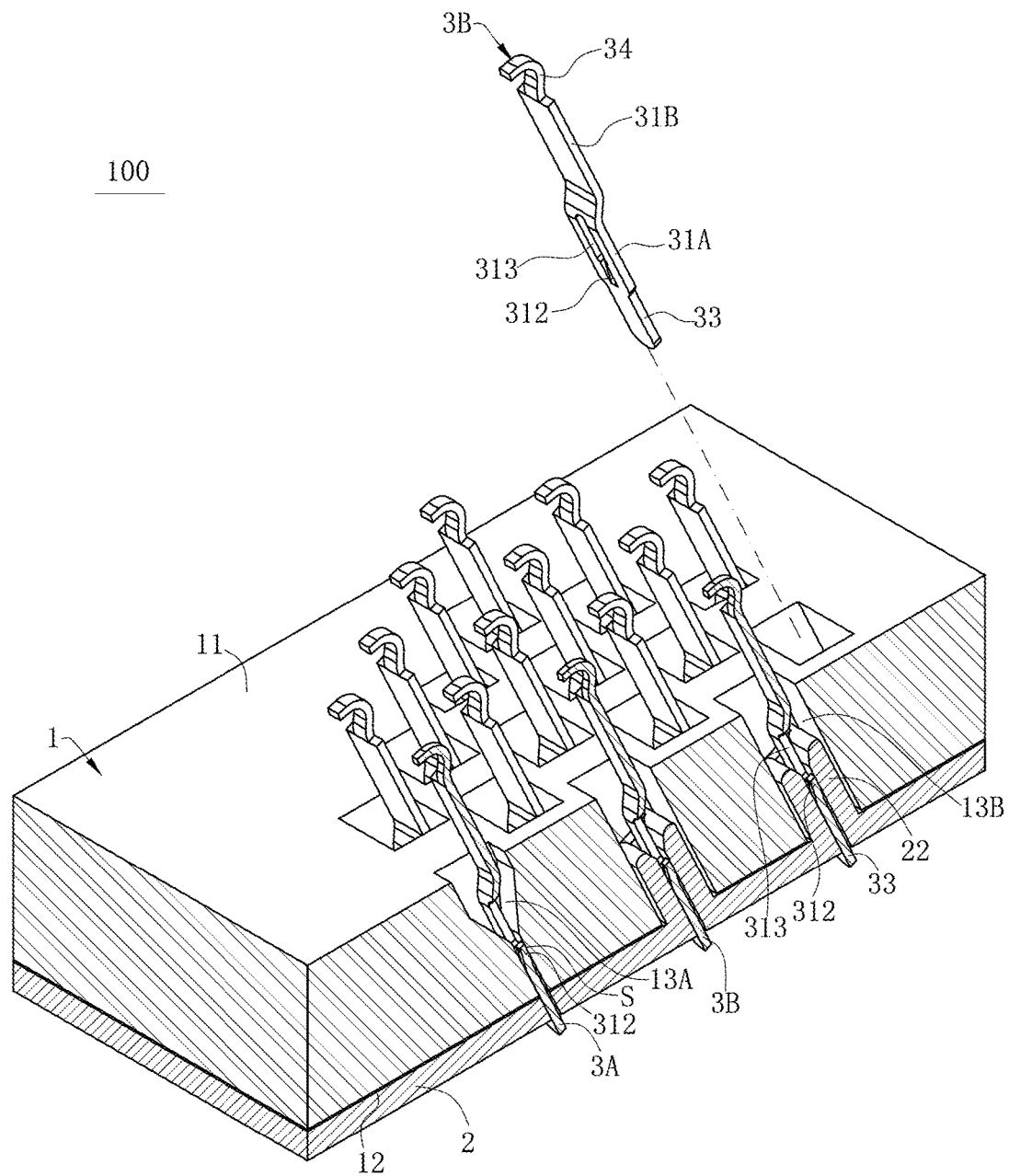
FIG. 8 is a perspective assembly view of the electrical connector according to a second embodiment of the present invention.
Figure 9:
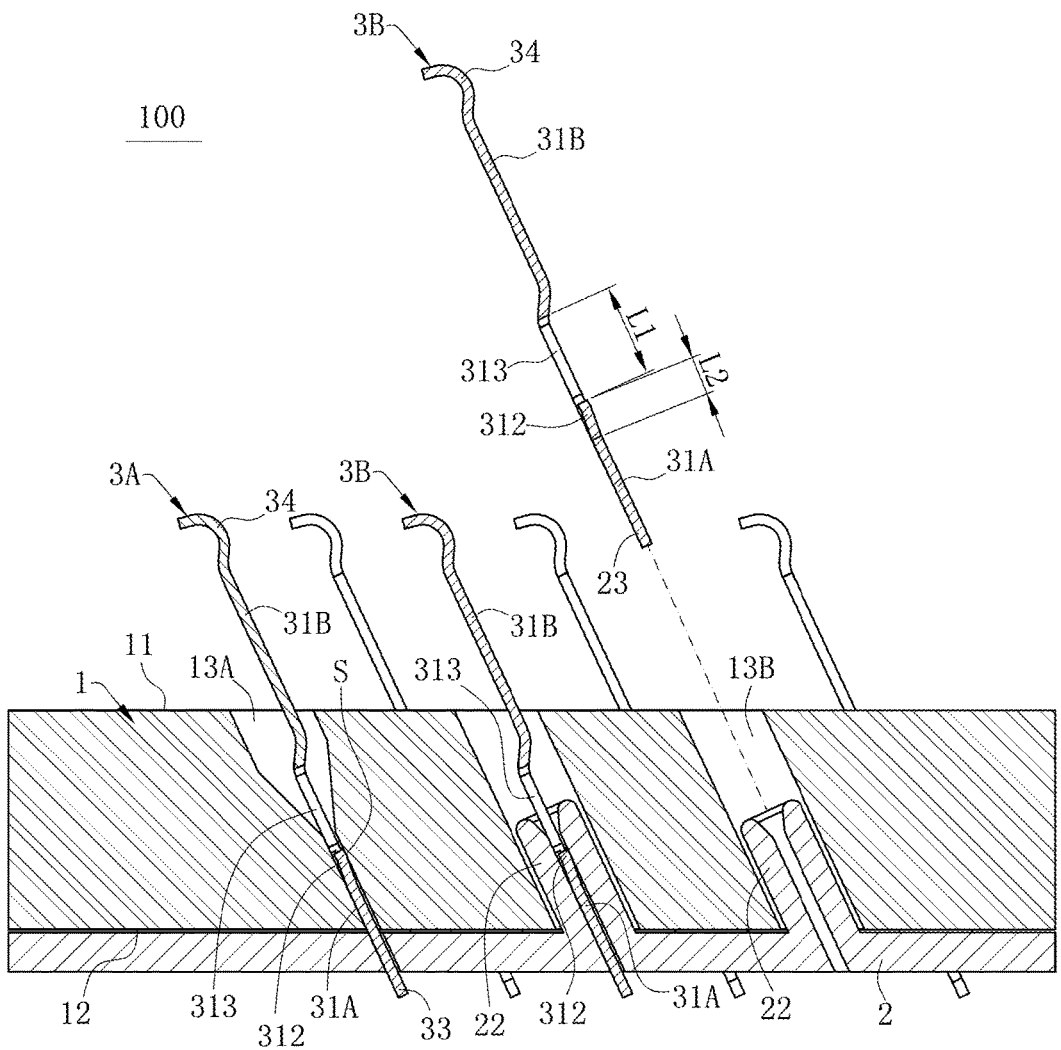
FIG. 9 is a front view of FIG. 8.

FIG. 8 to FIG. 9 show an electrical connector 100 according to the second embodiment of the present invention. The main differences of the present embodiment from the foregoing first embodiment exist as follows. The inner side surfaces of the ground accommodating holes 13A and the signal accommodating holes 13B are inclined relative to the upper surface 11 and the lower surface 12. Moreover, the side surfaces and the top surfaces of the accommodating portions 22 are inclined relative to the upper surface 11 and the lower surface 12. Consequently, while the height of the body 1 is not changed, the lengths of the ground terminals 3A and the signal terminals 3B are increased, and the elasticity of the ground terminals 3A and the signal terminals 3B is enhanced.

Each signal terminal 3B has a first section 31A located in one accommodating portion 22, where the soldering portion 33 is formed by extending downward from the first section 31A; a second section 31B bending upward and extending from the first section 31A; and a contact portion 34 formed by bending upward and extending from the second section 31B and configured to be connected to the chip module 5. The first section 31A and the second section 31B are approximately shaped like a flat plate and have the same width, and the second section 31B is approximately parallel to the first section 31A. Consequently, the structure of the signal terminal 3B is simplified, and the machining of the signal terminal 3B is facilitated.

The first section 31A has a through hole 313, and the second positioning portion 312 is formed by tearing from the through hole 313 to match with and be positioned in one accommodating portion 22. A length L1 of the through hole 313 is greater than a length L2 of the second positioning portion 312, and the through hole 313 extends upward beyond the accommodating portion 22, thereby enhancing the elasticity of the first section 31A.

The ground terminals 3A and the signal terminals 3B have the same structure, which is not elaborated herein.

Figure 10:
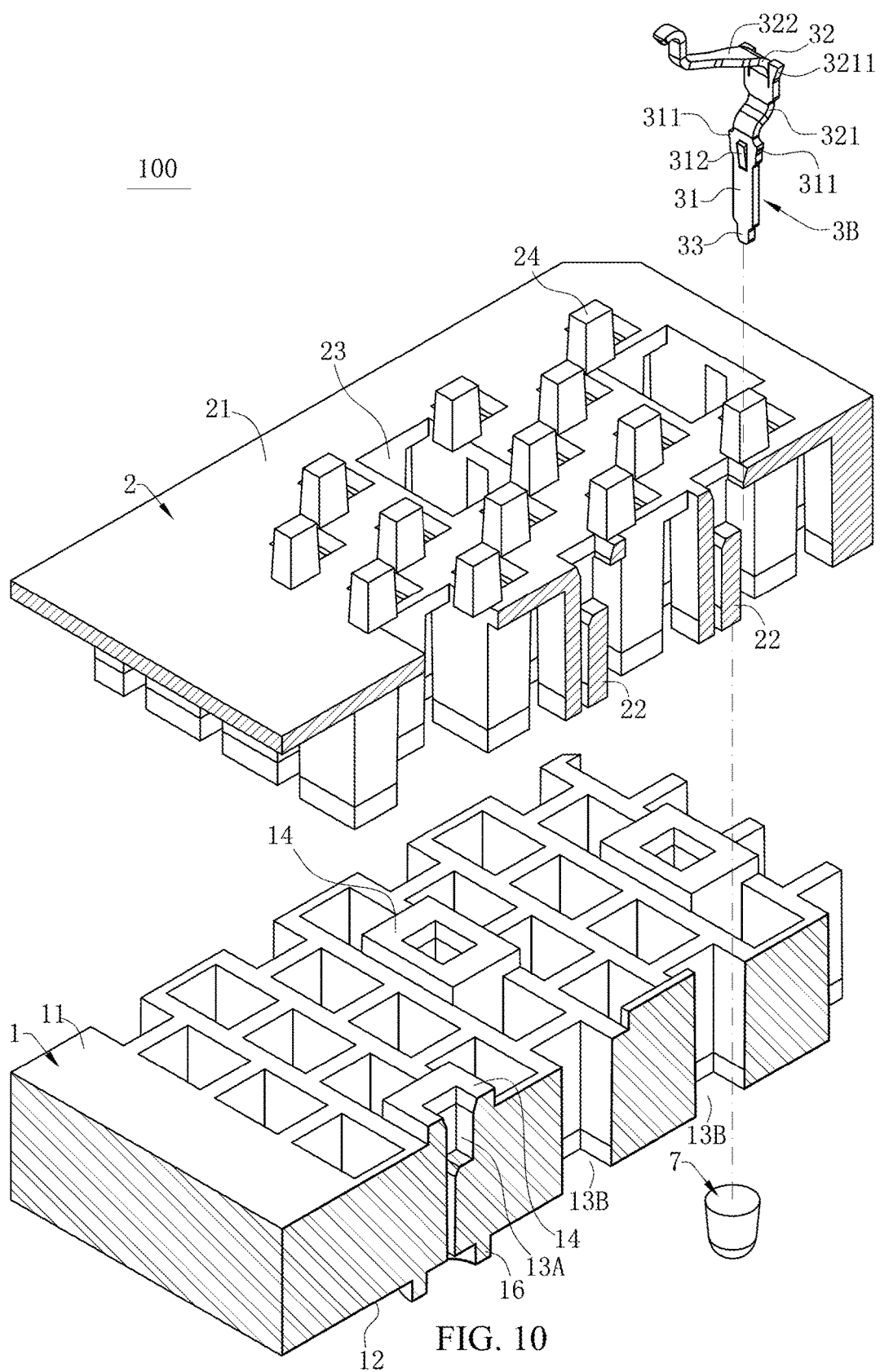
FIG. 10 is a perspective exploded view of the electrical connector according to a third embodiment of the present invention.
Figure 11:
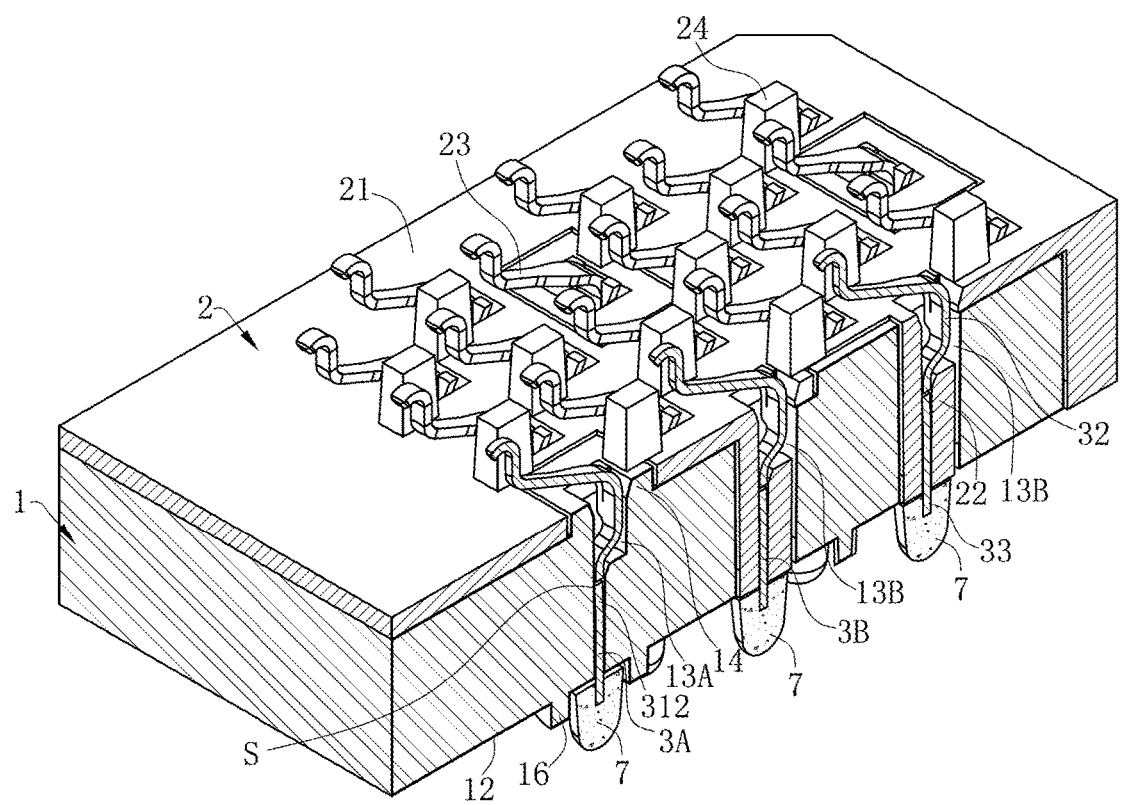
FIG. 11 is a perspective view of the insulating member being mounted upon the body in FIG. 10.
Figure 12:
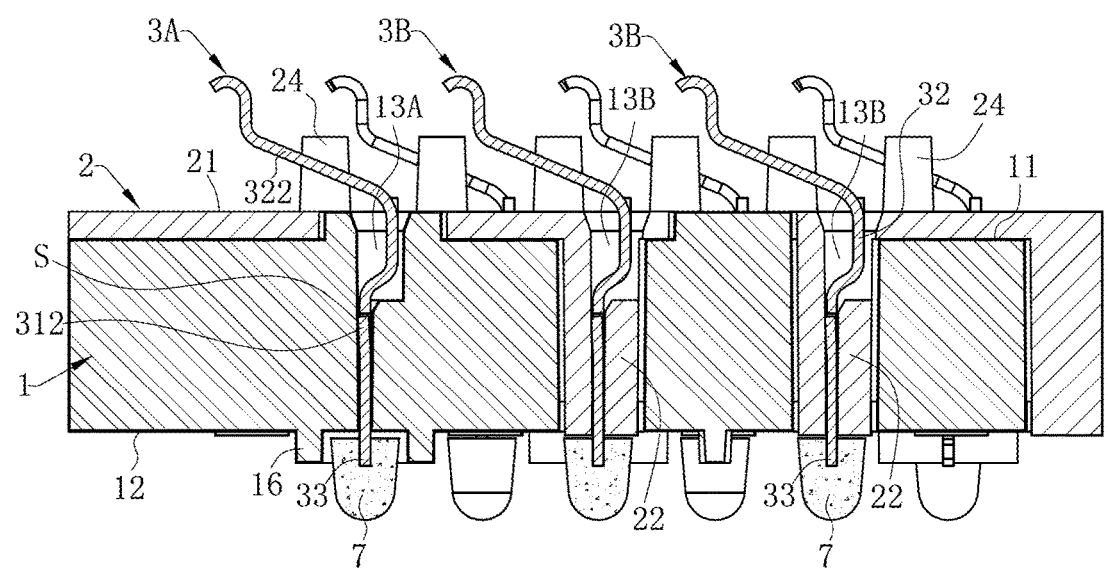
FIG. 12 is a front view of FIG. 11.

FIG. 10 to FIG. 12 show an electrical connector 100 according to a third embodiment of the present invention. The main differences of the present embodiment from the foregoing first embodiment exist as follows. The insulating member 2 is arranged above the body 1. The electrical connector 100 is not provided with the supporting cover 4; instead, multiple supporting portions 24 are formed by extending upward from the main body 21 to support the chip module 5.

The bottom surfaces of the accommodating portions 22 are lower than the lower surface 12 of the body 1. The lower surface 12 is electrically conductive, thereby preventing the signal terminals 3B from short-circuiting due to contact with the lower surface 12. Further, the body 1 has a frame portion 16 (being electrically conductive) which is formed by extending downward from the lower surface 12 and configured to accommodate the soldering portions 33 of the ground terminals 3A and the solders 7. The soldering portions 33 of the ground terminals 3A can be in contact with the frame portion 16 through the solders 7 to achieve the electrical connection between the soldering portions 33 of the ground terminals 3A and the frame portion 16, thereby enhancing the shielding effect of the electrical connector 100.

To sum up, the electrical connector according to certain embodiments of the present invention has the following beneficial effects:

(1) As the insulating member 2 is provided with multiple accommodating portions 22 corresponding only to the signal accommodating holes 13B and accommodated in the signal accommodating holes 13B, and the signal terminals 3B are positioned correspondingly in the accommodating portions 22, the accommodating portions 22 can prevent the signal terminals 3B from being in contact with the inner sides of the signal accommodating holes 13B, thereby preventing short-circuiting of the signal terminals 3B. Meanwhile, because the insulating member 2 is not provided with any accommodating portion 22 corresponding to and accommodated in the ground accommodating holes 13A, the ground terminals 3A can be in contact with the inner side surfaces of the ground accommodating holes 13A, thereby achieving grounding, and ensuring the shielding effect of the electrical connector 100. Moreover, the ground terminals 3A and the signal terminals 3B can have the same structure, thus decreasing the difficulty of machining the ground terminals 3A and the signal terminals. Furthermore, an operator does not need to differentiate the positions of the ground terminals 3A and the signal terminals 3B any more, thereby decreasing the difficulty of assembling the ground terminals 3A and the signal terminals 3B, preventing the signal terminals 3B from being assembled at the positions of the ground terminals 3A by mistake to cause the ground terminals 3A to fail to be in contact with the inner sides of the ground accommodating holes 13A, ensuring the shielding effect of the electrical connector 100, and enhancing the anti-interference capability during signal transmission.

(2) The first arm 321 and the stopping surface 15 are located on the two opposite sides of the flat plate portion 31, thereby reducing the space occupied by the signal accommodating holes 13B.

(3) One side of each first arm 321 is protrudingly provided with a strip-connecting portion 3211, which is configured to be connected to a strip, and the strip-connecting portions 3211 are parallel to the flat plate portions 31. Because the first arms 321 are close to the upper surface 11 of the body 1, the height of each strip-connecting portion 3211 can be reduced, thereby enhancing the strength of the strip-connecting portions 3211, and allowing the strip to be broken conveniently.

(4) The body 1 has the frame portion 16 (being electrically conductive) which is configured to accommodate the soldering portions 33 of the ground terminals 3A and the solders 7, and the soldering portions 33 of the ground terminals 3A can be electrically connected to the frame portion 16 through the solders 7, thereby enhancing the shielding effect of the electrical connector 100.

The above detailed description only describes preferable embodiments of the present invention, and is not intended to limit the patent scope of the present invention, so any equivalent technical changes made by use of the specification of the creation and the content shown in the drawings fall within the patent scope of the present invention.

While there has been shown several and alternate embodiments of the present invention, it is to be understood that certain changes can be made as would be known to one skilled in the art without departing from the underlying scope of the present invention as is discussed and set forth above and below including claims. Furthermore, the embodiments described above and claims set forth below are only intended to illustrate the principles of the present invention and are not intended to limit the scope of the present invention to the disclosed elements.

What is claimed is:

1. An electrical connector, comprising:
    a body, provided with a plurality of ground accommodating holes and a plurality of signal accommodating holes vertically running through the body, wherein inner side surfaces of the ground accommodating holes and the signal accommodating holes are electrically conductive;
    an insulating member, separately formed from the body, wherein the insulating member is provided with a plurality of accommodating portions corresponding only to the signal accommodating holes, and the accommodating portions are accommodated in the signal accommodating holes; and
    a plurality of terminals, each having the same structure and respectively provided with a flat plate portion and an elastic arm formed by bending upward and extending from the flat plate portion, wherein the flat plate portion is provided with at least one positioning portion, and the terminals include a plurality of signal terminals and a plurality of ground terminals; wherein the signal terminals are correspondingly accommodated in the signal accommodating holes, the positioning portion of each of the signal terminals is correspondingly positioned to one of the accommodating portions so that the signal terminals are not in contact with the signal accommodating holes, and the elastic arm of each of the signal terminals is configured to be in contact with a chip module, wherein a bent portion between the elastic arm and the flat plate portion of each of the signal terminals is exposed upward out of the corresponding one of the accommodating portions and is completely located in a corresponding one of the signal accommodating holes; and the ground terminals are correspondingly accommodated in the ground accommodating holes, the positioning portion of each of the ground terminals is correspondingly positioned on the inner side surface of one of the ground accommodating holes, so that the inner side surface of each of the ground accommodating holes has a contact area in contact with the positioning portion of a corresponding one of the ground terminals, and a height of the contact area is between a highest point and a lowest point of each of the accommodating portions.

2. The electrical connector according to claim 1, wherein the insulating member is provided with a plurality of holes corresponding to the ground terminals, the body is provided with a plurality of position limiting portions corresponding to and accommodated in the holes, and the ground terminals pass through the position limiting portions.

3. The electrical connector according to claim 1, wherein the body has an upper surface and a lower surface arranged opposite to each other, the ground accommodating holes and the signal accommodating holes run through the upper surface and the lower surface, the inner side surfaces of the ground accommodating holes and the signal accommodating holes are inclined relative to the upper surface and the lower surface, and side surfaces of the accommodating portions are inclined relative to the upper surface and the lower surface.

4. The electrical connector according to claim 3, wherein each of the signal terminals has a through hole accommodated in and extending upward beyond a corresponding one of the accommodating portions, the positioning portion of each of the signal terminals is formed by tearing from the through hole to match with and be positioned to the corresponding one of the accommodating portions, and a length of the through hole is greater than a length of the positioning portion.

5. The electrical connector according to claim 1, wherein the elastic arm has a first arm formed by bending upward and extending from the flat plate portion in a direction away from a vertical plane of the flat plate portion, and a second arm bending backward from the first arm and extending beyond the vertical plane of the flat plate portion, wherein the second arm is configured to upward abut the chip module, one side of the first arm is protrudingly provided with a strip-connecting portion configured to be connected to a strip, and the strip-connecting portion is parallel to the flat plate portion.

6. The electrical connector according to claim 1, wherein the elastic arm has a first arm formed by upwardly bending and extending from the flat plate portion in a direction away from the vertical plane of the flat plate portion, and a second arm bending backward from the first arm and extending beyond the vertical plane of the flat plate portion, the second arm is configured to upwardly abut against the chip module, each of the signal accommodating holes has a stopping surface located above or below a corresponding one of the accommodating portions to stop the corresponding one of the accommodating portions vertically downward or upward, and the first arm and the stopping surface are located on two opposite sides of the flat plate portion.

7. An electrical connector, comprising:

a body, provided with a plurality of ground accommodating holes and a plurality of signal accommodating holes vertically running through the body, wherein surfaces of the ground accommodating holes and the signal accommodating holes are respectively electrically conductive;

an insulating member, separately formed from the body; and a plurality of signal terminals and a plurality of ground terminals with same structure, correspondingly accommodated in the signal accommodating holes and the ground accommodating holes respectively, and respectively provided with a flat plate portion and an elastic arm formed by bending upward and extending from the flat plate portion, wherein the elastic arm bends and extends upward from the flat plate portion to form a bent portion, the elastic arm is configured to be in contact with a chip module, and the flat plate portion is provided with at least one positioning portion, wherein the positioning portions of the signal terminals are positioned in the insulating member, so that the signal terminals are not in contact with the surfaces of the signal accommodating holes, and the bent portion of each of the signal terminals is exposed upward out of the insulating member and is completely located in a corresponding one of the signal accommodating holes;

the positioning portions of the ground terminals are positioned on the surfaces of the ground accommodating holes, so that the surface of each of the ground accommodating holes has a contact area in contact with the positioning portion of a corresponding one of the ground terminals, and a height of the contact area is between a highest point and a lowest point of the insulating member.

8. The electrical connector according to claim 7, wherein the insulating member is provided with a plurality of holes corresponding to the ground terminals, the body is provided with a plurality of position limiting portions corresponding to and accommodated in the holes, and the ground terminals pass through the position limiting portions.

9. The electrical connector according to claim 7, wherein the elastic arm has a first arm formed by bending upward and extending from the flat plate portion in a direction away from a vertical plane of the flat plate portion, and a second arm bending backward from the first arm and extending beyond the vertical plane of the flat plate portion, wherein the second arm is configured to upward abut the chip module, one side of the first arm is protrudingly provided with a strip-connecting portion configured to be connected to a strip, and the strip-connecting portion is parallel to the flat plate portion.

10. The electrical connector according to claim 7, wherein a size of each of the ground accommodating holes is smaller than a size of each of the signal accommodating holes along a horizontal direction, the insulating member is provided with a plurality of accommodating portions corresponding only to the signal accommodating holes and accommodated in the signal accommodating holes, and the positioning portions of the signal terminals are positioned in the accommodating portions.

11. An electrical connector, comprising:
a body, provided with a plurality of ground accommodating holes and a plurality of signal accommodating holes vertically running through the body, wherein inner side surfaces of the ground accommodating holes and the signal accommodating holes are electrically conductive;
an insulating member, separately formed from the body, wherein the insulating member is provided with a plurality of accommodating portions corresponding only to the signal accommodating holes, and the accommodating portions are accommodated in the signal accommodating holes; and
a plurality of terminals, each having the same structure and respectively provided with a through hole and a positioning portion formed by tearing from the through hole, the terminals include a plurality of signal terminals and a plurality of ground terminals; wherein
the signal terminals are correspondingly accommodated in the signal accommodating holes, wherein the through hole of each of the signal terminals is accommodated in and extends upward beyond a corresponding one of the accommodating portions, a length of the through hole of each of the signal terminals is greater than a length of the positioning portion of each of the signal terminals, and the positioning portion of each of the signal terminals is correspondingly positioned to the corresponding one of the accommodating portions so that the signal terminals are not in contact with the signal accommodating holes; and
the ground terminals are correspondingly accommodated in the ground accommodating holes, the positioning portion of each of the ground terminals is correspondingly positioned on the inner side surface of one of the ground accommodating holes, so that the inner side surface of each of the ground accommodating holes has a contact area in contact with the positioning portion of a corresponding one of the ground terminals, and a height of the contact area is between a highest point and a lowest point of each of the accommodating portions.

12. The electrical connector according to claim 11, wherein the body has an upper surface and a lower surface arranged opposite to each other, the ground accommodating holes and the signal accommodating holes run through the upper surface and the lower surface, the inner side surfaces of the ground accommodating holes and the signal accommodating holes are inclined relative to the upper surface and the lower surface, and side surfaces of the accommodating portions are inclined relative to the upper surface and the lower surface.

* * * * *